US005750942A

United States Patent [19]

Flick

[11] Patent Number: 5,750,942

[45] Date of Patent: May 12, 1998

[54] VEHICLE WINDOW SPEAKER MOUNTING ACCESSORY AND RELATED METHODS

[76] Inventor: Kenneth E. Flick, 5236 Presley Pl., Douglasville, Ga. 30135

[21] Appl. No.: 677,240

[22] Filed: Jul. 9, 1996

[51] Int. Cl.⁶ ........ H05K 5/00

[52] U.S. Cl. ........ 181/141; 181/150; 296/146.1

[58] Field of Search ........ 181/141, 150, 181/171, 199; 381/86, 88, 90, 188, 205; 296/146.1, 152

[56] References Cited

U.S. PATENT DOCUMENTS

| | | |
|---|---|---|
| D. 206,530 | 12/1966 | Zell . |
| D. 251,726 | 5/1979 | Smith et al. . |
| D. 277,841 | 3/1985 | Smith et al. . |
| D. 289,994 | 5/1987 | McNab et al. . |
| D. 337,561 | 7/1993 | Austin . |
| 2,934,374 | 4/1960 | Mortenson et al. . |
| 3,249,382 | 5/1966 | Swithenbank . |
| 3,521,403 | 7/1970 | Bouwkamp . |
| 3,770,312 | 11/1973 | Shadburn . |
| 3,912,323 | 10/1975 | Dancik . |
| 4,090,582 | 5/1978 | Deschu . |
| 4,393,753 | 7/1983 | Chatlos . |
| 4,566,728 | 1/1986 | Theodore . |
| 4,597,470 | 7/1986 | Takagi et al. ........ 181/141 |
| 4,854,636 | 8/1989 | Greenhalgh et al. . |
| 4,891,842 | 1/1990 | Green ........ 381/188 |
| 4,892,346 | 1/1990 | Berlin . |
| 4,993,774 | 2/1991 | Greenhalgh et al. . |
| 5,008,944 | 4/1991 | Sels et al. ........ 381/86 |
| 5,080,425 | 1/1992 | Austin . |
| 5,096,252 | 3/1992 | Brown ........ 181/141 X |

*Primary Examiner*—Khanh Dang

*Attorney, Agent, or Firm*—Allen, Dyer, Doppelt, Milbrath & Gilchrist, P.A.

[57] ABSTRACT

A window accessory for mounting one or more audio speakers within a rear window space of a vehicle includes transparent interior and exterior panels which together define an acoustic chamber for operation of the speakers. In one embodiment, speaker mounts are integrally formed with the exterior panel for supporting each speaker adjacent a speaker opening within the interior panel. The speakers may also be mounted by struts extending from a joint between the interior and exterior panels. A gap may be defined between each speaker periphery and the adjacent speaker opening periphery for providing an air baffle effect for the operation of the speakers within the acoustic chamber. The gap is sufficient so that separate air baffles are not needed. Method aspects of the invention are also disclosed.

28 Claims, 3 Drawing Sheets

VEHICLE WINDOW SPEAKER MOUNTING ACCESSORY AND RELATED METHODS

FIELD OF THE INVENTION

The invention relates generally to window accessories for vehicles, and, more particularly, to a window accessory for mounting audio speakers.

Background of Invention

Audio systems continue to be developed for providing high quality music reproduction, such as within a vehicle. It is well known that a variety of high powered car audio systems take up space in the trunks and other sections of many vehicles. When the vehicle is a pickup truck, for example, the available space for such components becomes limited, especially for stereo speakers because there is no rear deck adjacent the rear window as in a conventional passenger vehicle. Three-way speakers are often used when space is limited. In addition, speakers are typically mounted in side door panels, under dashes, and behind seats. Custom contoured window panels have also been used for expanding the space behind a driver within a pickup truck and with an interior panel installed within the window frame opening inside the truck cab for mounting audio speaker components, such as disclosed in U.S. Pat. No. 5,080,425 to Austin, for example.

To provide better sound quality larger speakers may be desired. Unfortunately, space is limited and good rearward vision needs to be maintained. The addition of head rests to seat backs further reduces the available window areas suitable for mounting the audio speakers. When air passives such as baffles are added to increase sound quality as in U.S. Pat. No. 5,080,425 vision may be further reduced.

SUMMARY OF INVENTION

In view of the foregoing background, it is therefore an object of the invention to provide a window accessory and associated method for mounting one or more audio speakers within a rear window space of a vehicle, such as a pick up truck or van, and which reduces rear vision blockage while providing high quality sound.

This and other objects, advantages and features of the present invention are provided by one embodiment of a window accessory for mounting one or more audio speakers within a rear window space of a vehicle which comprises: an interior panel for installation within the window space, the interior panel having one or more speaker openings for admitting sound therethrough; an exterior panel for installation within the window space and for defining an acoustic chamber with the interior panel; and audio speaker mounting means extending from a front surface of the exterior panel for mounting the one or more audio speakers to be positioned adjacent respective speaker openings in the interior panel.

In one embodiment of the present invention, the audio speaker mounting means preferably positions the audio speakers to define a gap with adjacent portions of the interior panel for providing an air baffle effect for the acoustic chamber. Accordingly, the need for separate air baffles within the interior panel is eliminated and while providing high quality sound. Vision is also improved since separate air baffles are not needed. Unwanted vibration or resonance may also be reduced by mounting the speakers from the exterior panel. In another embodiment of the invention the speakers may be mounted via generally vertically extended struts supported at the joint between the interior and exterior panels.

A method aspect of the present invention is for mounting one or more speakers within a rear window space of a vehicle. The method preferably comprises the steps of: installing an interior panel within the window space, the interior panel having one or more speaker openings for admitting sound therethrough; installing an exterior panel within the window space for defining an acoustic chamber with the interior panel; and mounting one or more audio speakers from a front surface of the exterior panel or from vertical struts so that the speakers are positioned adjacent respective speaker openings in the interior panel.

The method also preferably includes mounting the one or more audio speakers wherein each speaker is positioned to define a gap with adjacent portions of the interior panel for providing an air baffle effect for the acoustic chamber. Accordingly, each speaker can operate within the chamber without the need for separate air baffles, thus avoiding unnecessary vision blocking of the rear view window opening of the vehicle.

BRIEF DESCRIPTION OF DRAWINGS

A preferred embodiment of the invention as well as alternate embodiments are described by way of example with reference to the accompanying drawings in which.

DETAILED DESCRIPTION OF PREFERRED EMBODIMENT

Figure 1:
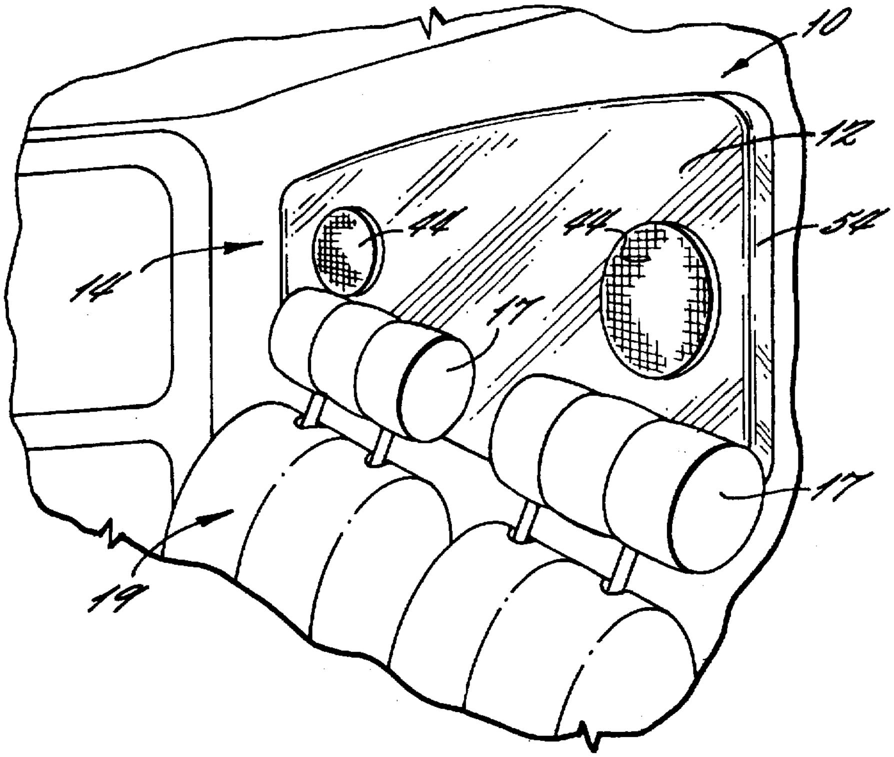
FIG. 1 is a partial front driver side perspective view of a vehicle cab interior illustrating a window accessory interior panel arrangement of one embodiment of the present invention.
Figure 2:
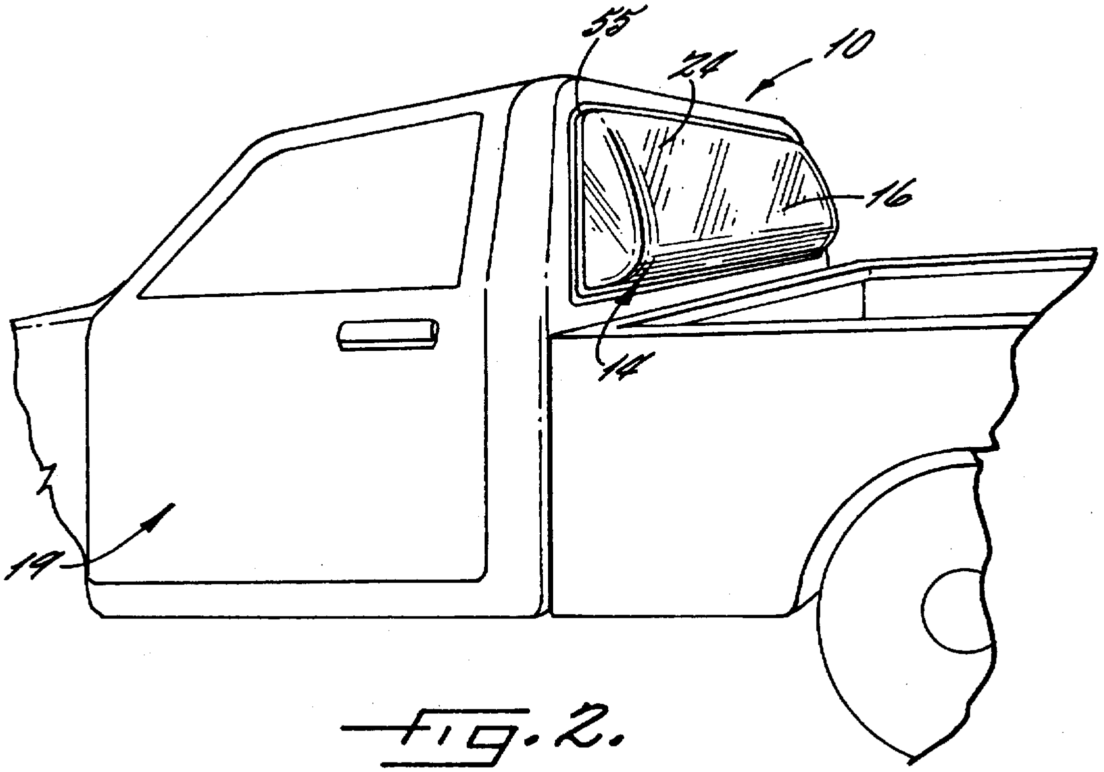
FIG. 2 is a partial rear driver side perspective view of an exterior of the vehicle, illustrating a window accessory exterior panel of the embodiment of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring now to FIGS. 1–4, a vehicle window speaker mounting accessory 10 of the present invention includes a transparent interior panel 12 in combination with a contoured transparent exterior panel 16 for providing an acoustical chamber 18 within the rear window space 14 of the vehicle 19. The exterior panel 16 has an interior or front surface 22 when installed within the vehicle 19, and an exterior or rear surface 24. The front surface 22 opposes the interior panel 12, and the rear surface 24 is exposed outside the vehicle 19 as illustrated. The interior of the vehicle 19 includes headrests 17 as would be readily understood by those skilled in the art. The acoustical chamber 18 provides useable space for mounting and operating audio speakers 20 therein without encroaching on the useful interior space within the vehicle.

Audio speaker mounting means 26 are illustratively provided by arcuate wall supports 28 extending from the exterior panel front surface 22 forward toward the interior panel 12 for mounting one or more audio speakers 20 for positioning the speakers adjacent respective speaker openings 32 within the acoustical chamber 18. The audio speaker mounting means 26 illustratively positions each speaker 20 such that a gap 34 is formed between the speaker peripheral portion 30 and the interior panel rear surface proximate the periphery of the speaker opening 32. Such a gap 34 provides an air passive or baffle effect for the speaker 20 when operating within the acoustic chamber 18.

Figure 3:
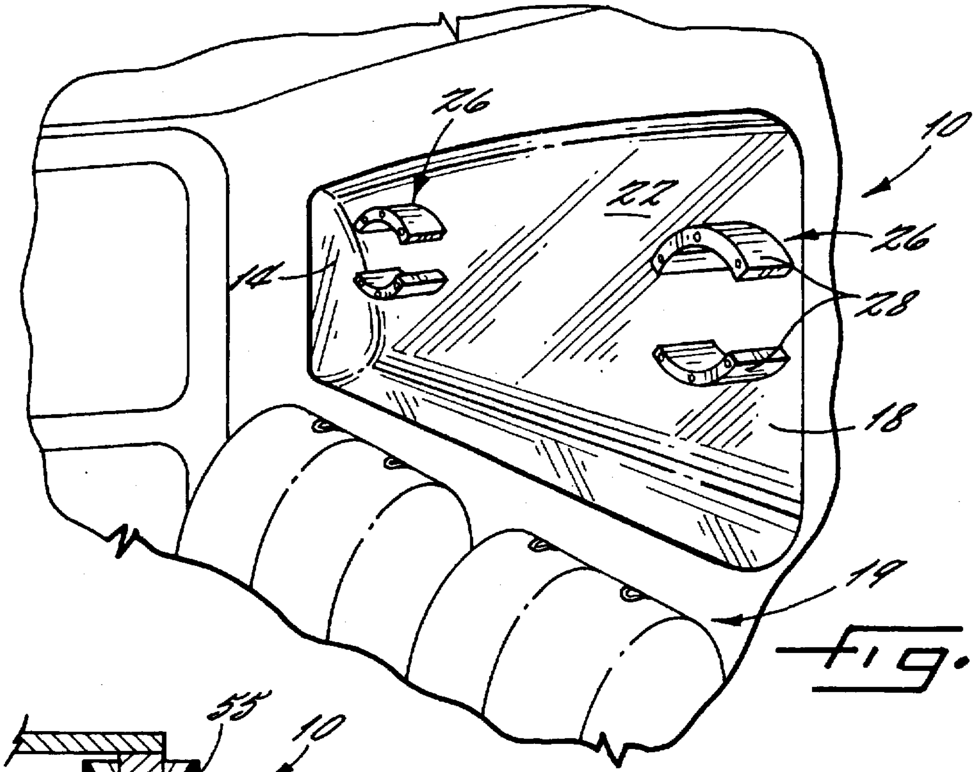
FIG. 3 is a partial front driver side perspective view of the vehicle cab of FIG. 1 wherein the interior panel has been removed illustrating a front surface of the exterior panel of FIG. 2.
Figure 4:
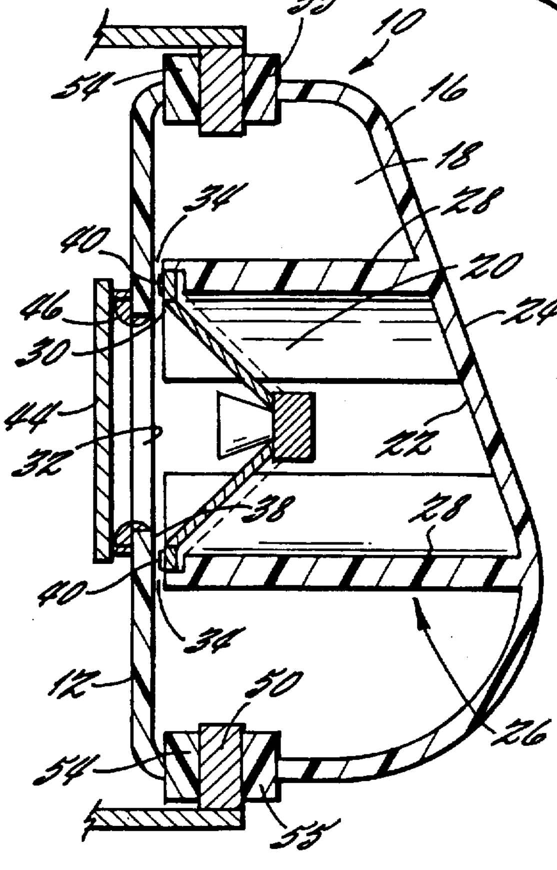
FIG. 4 is a cross-sectional view of an embodiment of he present invention illustrating a speaker mount integrally formed with the exterior panel.

In the embodiment illustrated with particular reference to FIGS. 3 and 4, the arcuate wall supports 28 provide the audio speaker mounting means 26 and are preferably integrally formed with the exterior panel 16, such as by molding a transparent plastic material as would be readily understood by those skilled in the art. The supports 28 as illustrated are contoured to fit partially around the speaker peripheral portion 30 and define a portion of an ellipse, but many other shapes or configurations are contemplated by the present invention. The audio speaker mounting means 26 further includes fasteners 40, such as screws or clips, associated with the support end portions for securing the speakers 20 thereto.

As illustrated, the interior panel 12 is preferably continuous but for the speaker openings 32 and is devoid of separate air baffles. Accordingly, vision is thereby improved. A porous speaker grill or cover 44 is attached to the interior panel 12 for covering each of the openings 32. In the illustrated embodiment of the present invention, clips 46 are used for attaching the cover 44 along the periphery of the opening 32. It will be readily understood by those skilled in the art that alternate attaching devices and methods may also be used.

Figure 5:
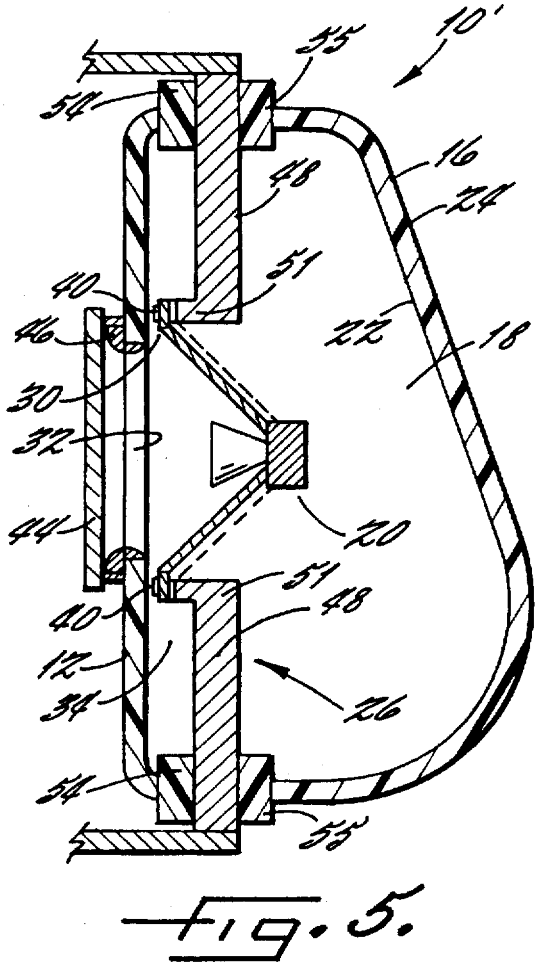
FIG. 5 is a cross-sectional view of another embodiment of the present invention illustrating an alternate speaker mount.

In an alternate embodiment of the present invention as shown in FIG. 5, the mounting means 26 includes one or more vertical supports or struts 48 secured to a vehicle window frame opening peripheral portion. In other words, the struts 48 are connected to the vehicle at the joint between the interior panel 12 and the exterior panel 16, such as between the flanges 54, 55. As described earlier, the mounting means 26 includes fasteners 40 associated with end portions 51 of the supports 48. Further, in keeping with the present invention, the gap 34, cover 44, and other elements are as described earlier with reference to FIGS. 1–4.

Figure 6:
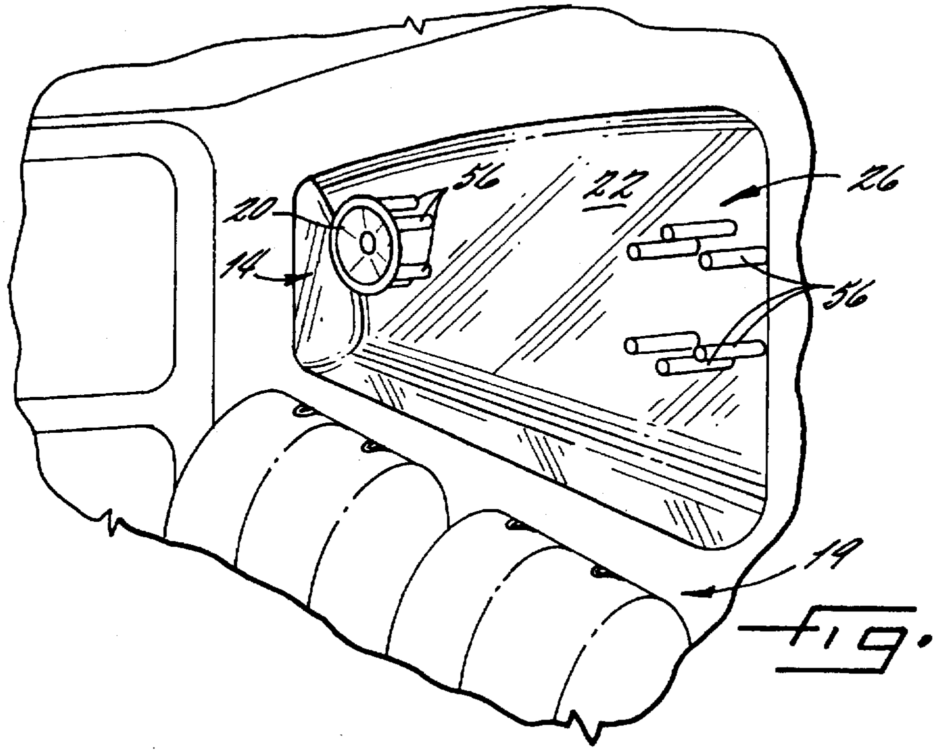
FIG. 6 is a partial front driver side perspective view of a vehicle cab interior wherein the interior panel of the window accessory has been removed illustrating another embodiment of the speaker mount.
Figure 7:
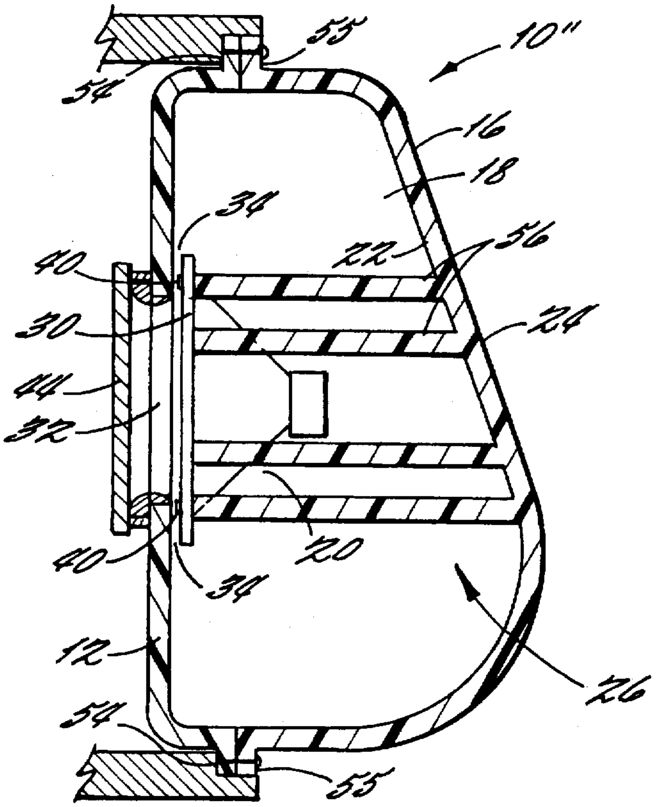
FIG. 7 is a cross-sectional view of the alternate speaker mount embodiment of FIG. 6.

In another embodiment of the present invention, as understood with reference to FIGS. 6 and 7, the flanges 54, 55 of the interior and exterior panels 12, 16 respectively are assembled together and in an assembly attached to the window peripheral portion. The illustrated embodiment of the mounting means 26 includes posts 56 integrally formed with the exterior panel 16 and extending forward into the acoustic chamber 18 toward the interior panel 12 for providing the gap 34 between the speaker peripheral portion 30 and interior panel rear surface proximate the opening periphery 38.

The interior panel 12 and exterior panel 16 are formed from transparent material and each include a peripheral flange 54, 55 for attaching the panels 12, 16 to the window frame peripheral portion 50 by methods well known in the art. Further, it will be readily understood by those skilled in the art that the exterior panel 16 may be formed from an acrylic plastic or other transparent material suitable for use as a vehicle window. Various contours are contemplated by the present invention. It is the formation of the acoustic chamber 18 having sufficient space for housing speakers 20 of varying dimension that is important, and sufficient depth for positioning the speaker 20 such that the gap 34 as earlier described can be maintained. The window accessory 10 may also be positioned in other types of vehicles, such as a travel van or other van as would be readily understood by those skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and alternate embodiments are intended to be included within the scope of the appended claims.

That which is claimed is:

1. A window accessory for mounting one or more audio speakers within a rear window space of a vehicle, the window accessory comprising:

an interior panel for installation within the rear window space of the vehicle, the interior panel having one or more speaker openings for admitting sound therethrough;

an exterior panel for installation within the rear window space and for defining an acoustic chamber with the interior panel, the exterior panel having a front surface opposing the interior panel; and audio speaker mounting means carried by the exterior panel and extending from the front surface of the exterior panel toward the interior panel for mounting one or more audio speakers to be positioned adjacent respective speaker openings in the interior panel.

2. A window accessory according to claim 1, wherein the audio speaker mounting means positions the one or more audio speakers in a spaced relation with adjacent portions of the interior panel for providing a gap therebetween and thus a baffle effect for the acoustic chamber.

3. A window accessory according to claim 2, wherein the audio speaker mounting means positions the one or more audio speakers to define a gap between a periphery of the speaker opening and a periphery of a corresponding speaker.

4. A window accessory according to claim 1, wherein the audio speaker mounting means is integrally formed with the exterior panel.

5. A window accessory according to claim 1, wherein the audio speaker mounting means comprises a plurality of supports and fasteners associated with end portions of the supports.

6. A window accessory according to claim 1, wherein the interior and exterior panels comprise transparent material.

7. A window accessory according to claim 1, wherein the interior panel is continuous except for the speaker openings.

8. A window accessory according to claim 1, further comprising a porous cover attached to the interior panel for covering each of the one or more speaker openings.

9. A window accessory for mounting one or more audio speakers within a rear window space of a vehicle, the window accessory comprising:

a transparent interior panel for installation within the rear window space of the vehicle, the interior panel having one or more speaker openings for admitting sound therethrough;

a transparent exterior panel for installation within the rear vehicle window space and for defining an acoustic chamber with the interior panel, the exterior panel having a front surface opposing the interior panel; and audio speaker mounting means carried by the transparent exterior panel and extending from the front surface of the exterior panel toward the interior panel for mounting one or more audio speakers to be positioned adjacent respective speaker openings in the interior panel, the audio speaker mounting means further positioning the one or more audio speakers in a spaced relation with adjacent portions of the interior panel for providing a gap therebetween and thus an air baffle effect for the acoustic chamber.

10. A window accessory according to claim 9, wherein the gap is formed between a periphery of the speaker opening and a periphery of a corresponding speaker.

11. A window accessory according to claim 9, wherein the audio speaker mounting means is integrally formed with the exterior panel.

12. A window accessory according to claim 9, wherein the audio speaker mounting means comprises a plurality of supports and fasteners associated with end portions of the supports.

13. A window accessory according to claim 9, wherein the interior panel is continuous except for the speaker openings.

14. A window accessory according to claim 9, further comprising a porous cover attached to the interior panel for covering each of the one or more openings.

15. A window accessory for a rear window space of a vehicle, the window accessory comprising:

an interior panel for installation within the rear window space of the vehicle, the interior panel having one or more speaker openings for admitting sound therethrough;

an exterior panel for installation within the rear window space and for defining an acoustic chamber with the interior panel;

one or more audio speakers for operation within the acoustic chamber; and audio speaker mounting means carried within the acoustic chamber for mounting the one or more speakers to be positioned adjacent respective speaker openings in the interior panel and in spaced relation with adjacent portions of the interior panel for providing a gap therebetween and thus an air baffle effect for the acoustic chamber.

16. A window accessory according to claim 15, further comprising a porous cover attached to the interior panel for covering each of the one or more speaker openings.

17. A window accessory according to claim 15, wherein the audio speaker mounting means positions the one or more audio speakers to define a gap between a periphery of the speaker opening and a periphery of the adjacent speaker.

18. A window accessory according to claim 15, wherein the audio speaker mounting means is integrally formed with the exterior panel.

19. A window accessory according to claim 15, wherein said audio speaker mounting means comprises one or more supports extending from a joint between adjacent edge portions of said exterior and interior panels.

20. A window accessory according to claim 15, wherein the audio speaker mounting means comprises a plurality of supports extending from the exterior panel and fasteners associated with end portions of the supports.

21. A window accessory according to claim 15, wherein the interior and exterior panels comprise transparent material.

22. A window accessory according to claim 15, wherein the interior panel is continuous except for the speaker openings.

23. A method for mounting one or more speakers within a rear window space of a vehicle, the method comprising the steps of:

installing an interior panel within the rear window space of the vehicle, the interior panel having one or more speaker openings for admitting sound therethrough;

installing an exterior panel within the window space for defining an acoustic chamber with the interior panel, the exterior panel having a front surface opposing the interior panel; and mounting one or more audio speakers to be carried by the front surface of the exterior panel for positioning the one or more speakers adjacent respective speaker openings in the interior panel.

24. A vehicle speaker mounting method according to claim 23, wherein the step of mounting the one or more audio speakers comprises mounting each speaker in spaced relation with adjacent portions of the interior panel for providing a gap therebetween and thus an air baffle effect for the acoustic chamber.

25. A vehicle speaker mounting method according to claim 24, wherein the step of mounting comprises mounting each speaker to define a gap between a periphery of the speaker opening and a periphery of an adjacent speaker.

26. A vehicle speaker mounting method according to claim 23, wherein the step of mounting comprises the step of fastening each speaker to end portions of respective supports extending from the exterior panel.

27. A vehicle speaker mounting method according to claim 23, wherein the steps of installing comprise installing interior and exterior panels comprising transparent material.

28. A vehicle speaker mounting method according to claim 23, further comprising the step of attaching a porous cover to the interior panel for each of the one or more openings.

* * * * *